(12) United States Patent
Lindsay

(10) Patent No.: US 6,579,763 B1
(45) Date of Patent: Jun. 17, 2003

(54) METHODS OF FORMING AN ARRAY OF FLASH FIELD EFFECT TRANSISTORS AND CIRCUITRY PERIPHERAL TO THE ARRAY

(75) Inventor: Roger W Lindsay, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/179,894

(22) Filed: Jun. 24, 2002

(51) Int. Cl.[7] .............................................. H01L 21/336
(52) U.S. Cl. ...................................... 438/258; 438/241
(58) Field of Search ................................ 438/241, 258, 438/FOR 212

(56) References Cited

U.S. PATENT DOCUMENTS

| | | | |
|---|---|---|---|
| 6,265,267 B1 | * | 7/2001 | HUang |
| 6,380,031 B1 | * | 4/2002 | Mehrad et al. |
| 2002/0004270 A1 | * | 1/2002 | Moriwaki et al. |
| 2002/0100930 A1 | * | 8/2002 | Yaegashi |

OTHER PUBLICATIONS

U.S. patent application Ser. No. 10/179,893, Lindsay et al., filed Jun. 2002.
U.S. patent application Ser. No. 10/179,868, Lindsay et al., filed Jun. 2002.

Kim et al, Process Design for Preventing the Gate Oxide Thinning in the Integration of Dual Gate Oxide Transistor, 41 Jpn. J. Appl. Phys., Part 1, No. 4B, pp. 2404–2409 (Apr. 2002).

* cited by examiner

Primary Examiner—George Fourson
Assistant Examiner—Joannie Adelle Garcia
(74) Attorney, Agent, or Firm—Wells St. John P.S.

(57) ABSTRACT

A method of forming an array of FLASH field effect transistors and circuitry peripheral to the array includes etching periphery active area semiconductive material of a substrate substantially selectively relative to periphery field isolation while not etching array active area semiconductive material. After the periphery active area etching, at least some FLASH transistor control gate material is formed within the array and at least some non-FLASH transistor gate material is formed within the periphery. A method masking array active area semiconductive material while periphery active area semiconductive material is etched substantially selectively relative to the periphery field isolation. After the etching, the masking is removed. Thereafter, at least some FLASH transistor control gate material is formed within the array and at least some non-FLASH transistor gate material is formed within the periphery.

45 Claims, 9 Drawing Sheets

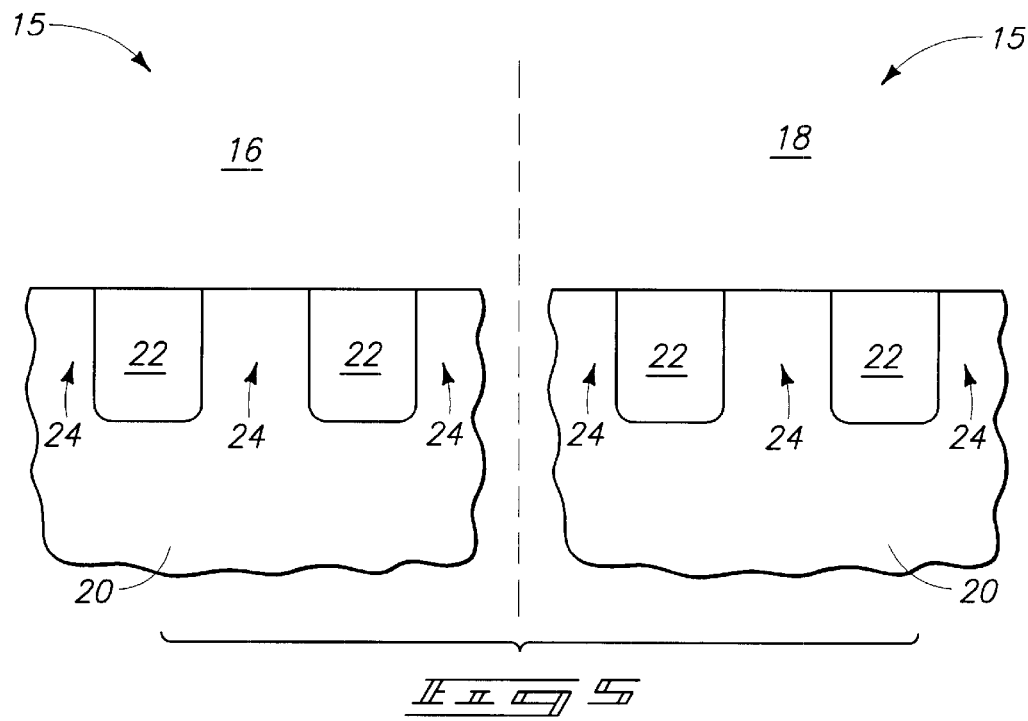
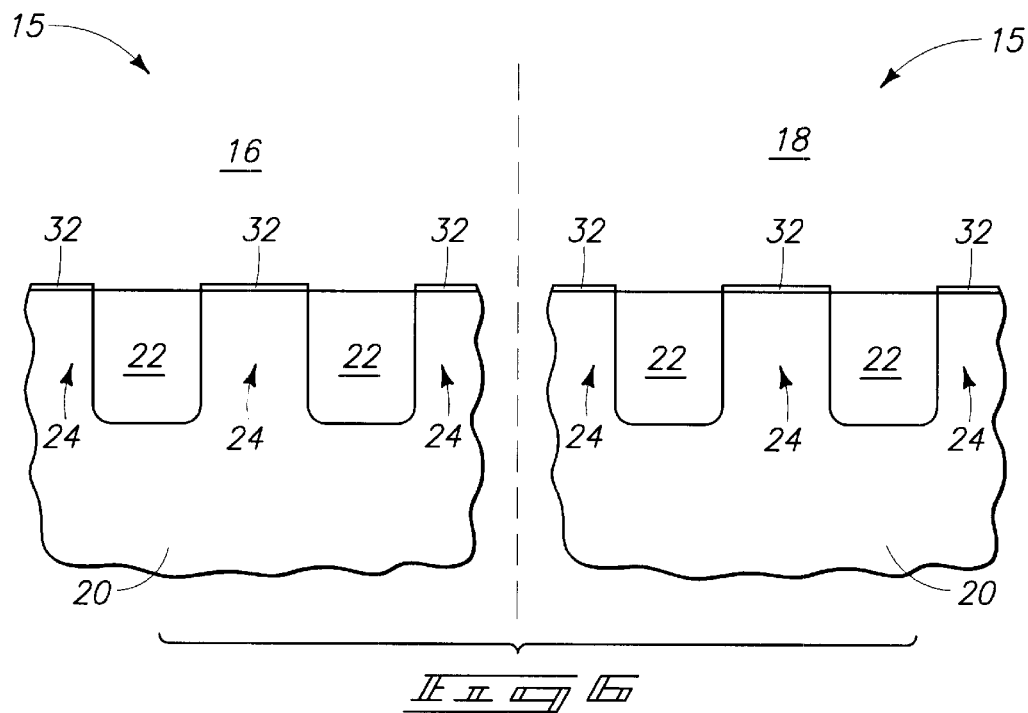

US 6,579,763 B1

METHODS OF FORMING AN ARRAY OF FLASH FIELD EFFECT TRANSISTORS AND CIRCUITRY PERIPHERAL TO THE ARRAY

TECHNICAL FIELD

This invention relates to methods of forming an array of FLASH Field effect transistors and circuitry peripheral to the array.

BACKGROUND OF THE INVENTION

Memory is but one type of integrated circuitry. Some memory circuitry allows for both on-demand data storage and data retrieval. For example, memories which allow both writing and reading, and whose memory cells can be accessed in a random order independent of physical location, are referred to as random-access memories (RAM). Read-only memories (ROMs) are those in which only the read operation can be performed rapidly. Entering data into a read-only memory is typically referred to as programming, and the operation is considerably slower than the writing operation utilized in random-access memory. With random-access memory, information is typically stored with respect to each memory cell either through charging of a capacitor or the setting of a state of a bi-stable flip-flop circuit. With either, the stored information is destroyed when power is interrupted. Read-only memories are typically non-volatile, with the data being entered during manufacturing or subsequently during programming.

Some read-only memory devices can be erased as well as written to by a programmer. Erasable read-only memory typically depends on the long-term retention of electronic charge as the information storage mechanism. The charge is typically stored on a floating semiconductive gate, such as polysilicon. One type of read-only memory comprises FLASH memory. Such memory can be selectively erased rapidly through the use of an electrical erase signal.

A FLASH memory cell typically comprises a single floating gate transistor. For multiple storage cells, such as used in large semiconductor memories, the storage cells of the memory are arranged in an array consisting of rows and columns. The rows are typically considered as comprising individual conductive gate lines formed as a series of spaced floating gates received along a single conductive line (hereafter referred to as "a line of floating gates"). Source and drain regions of the cells are formed relative to active area of a semiconductor substrate, with the active areas being generally formed in lines running substantially perpendicular to the lines of floating gates. The sources and drains are formed on opposing sides of the lines of floating gates within the active area with respect to each floating gate of the array. Thus, lines (rows) of programmable transistors are formed.

Electrical connections are made with respect to each drain to enable separate accessing of each memory cell. Such interconnections are arranged in lines comprising the columns of the array. The sources in FLASH memory, however, are typically all interconnected and provided at one potential, for example ground, throughout the array. Accordingly, the source regions along a given line of floating gates are typically all provided to interconnect within the substrate in a line running parallel and immediately adjacent the line of floating gates. These regions of continuously running source area are interconnected outside of the array, and strapped to a suitable connection for providing the desired potential relative to all the sources within the array.

FLASH memory fabrication typically includes an array of FLASH field effect transistors and circuitry which is peripheral to the array. Array FLASH field effect transistors and periphery field effect transistors typically have different gate dielectric or gate oxide thicknesses, and accordingly, are typically fabricated at different times. Usually, the periphery gate dielectric is generally thicker than the array gate dielectric due to higher voltage operation of periphery transistors as compared to that of the array. The periphery gate dielectric can be fabricated after the fabrication of the array gate dielectric. Unfortunately, this results in the typical isolation oxide within the periphery being subjected to a greater quantity of oxide etchings than occurs relative to the isolation oxide within the array. This can result in significant exposure of a corner of silicon where the active area meets the substrate isolation where a transistor gate passes from over active area to over isolation oxide. This can adversely affect the circuitry in operation.

FIG. 1 depicts the problem just described. A semiconductor wafer fragment 10 is shown as appearing in a periphery circuit area to an array of FLASH field effect transistors (not shown) being fabricated. Such comprises a bulk active area substrate region 11 having an adjacent region of trench isolation oxide 12. To produce the active area and trench or other field isolation, typical prior art processing would first deposit a pad oxide layer over the substrate and then a silicon nitride comprising layer thereover. The pad oxide and silicon nitride layer would be patterned and etched relative to the bulk substrate to define and form exposed isolation areas of the bulk substrate. With trench isolation, trenches would be etched into the bulk substrate and subsequently filled with an insulative isolation material, for example silicon dioxide. The substrate is then polished and/or etched effective to remove at least the masking silicon nitride and expose or etch through the pad oxide. The periphery is then masked, typically with photoresist, with the array left exposed. One or more conductivity modifying implants are then conducted into semiconductive material of the substrate within the array. Exemplary such implants include $V_t$ threshold implants and channel enhancement implants.

The mask is subsequently stripped and the entire substrate subjected to a thermal oxidation to form a sacrificial oxide. Typically, such oxide is grown to correct defects and otherwise improve the semiconductive material substrate outer portion/surface for a subsequent gate oxide growth. Thereafter, the sacrificial oxide and any remaining pad oxide are stripped from the substrate. Gate oxide is then formed which is optimized for the array, but/and also grows over the periphery in a blanket manner. Floating gate material is then deposited, with the array then being patterned in at least one dimension towards formation of the floating gates. In such patterning, all such floating control gate material and the gate dielectric are typically etched from the periphery.

Next, another gate dielectric (typically an oxide-nitride-oxide composite) is formed over the control gate material within the array, and accordingly, blanketly over the substrate and, therefore, within the periphery. The array is then masked, and then the gate dielectric formed in the periphery is stripped.

All of the above-described sacrificial oxidation stripping, first gate oxide stripping and second gate oxide stripping within the periphery has a tendency to form a recess 13 (FIG. 1) where isolation oxide 12 meets with active area bulk semiconductive material 11. Typically, a gate oxide layer 14 is formed next, optimized for the periphery field effect transistors. Such can result in the illustrated gate oxide thinning over the active area bulk material corner. This can lead to adverse operation of the circuitry in operation.

The invention was motivated in addressing the above-described issues and improving upon the above-described drawbacks. However, it is in no way so limited. The invention is only limited by the accompanying claims as literally worded (without interpretative or other limiting reference to the above background art description, remaining portions of the specification or the drawings) and in accordance with the doctrine of equivalents.

SUMMARY

The invention includes methods of forming an array of FLASH field effect transistors and circuitry peripheral to such array. In one implementation, a method of forming an array of FLASH field effect transistors and circuitry peripheral to the array includes etching periphery active area semiconductive material of a substrate substantially selectively relative to periphery field isolation while not etching array active area semiconductive material. After the periphery active area etching, at least some FLASH transistor control gate material is formed within the array and at least some non-FLASH transistor gate material is formed within the periphery.

In one implementation, a method of forming an array of FLASH field effect transistors and circuitry peripheral to the array includes forming active area semiconductive material and field isolation relative to an array area and a periphery area of a semiconductor substrate. Array active area semiconductive material is masked while periphery active area semiconductive material is etched substantially selectively relative to the periphery field isolation. After the etching, the masking is removed. Thereafter, at least some FLASH transistor control gate material is formed within the array and at least some non-FLASH transistor gate material is formed within the periphery.

Other aspects and implementations are contemplated.

BRIEF DESCRIPTION OF THE DRAWINGS

Preferred embodiments of the invention are described below with reference to the following accompanying drawings.

FIG. 5 is a view of the FIG. 4 wafer fragment at a processing step subsequent to that shown by FIG. 4.

FIG. 6 is a view of the FIG. 5 wafer fragment at a processing step subsequent to that shown by FIG. 5.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 2:
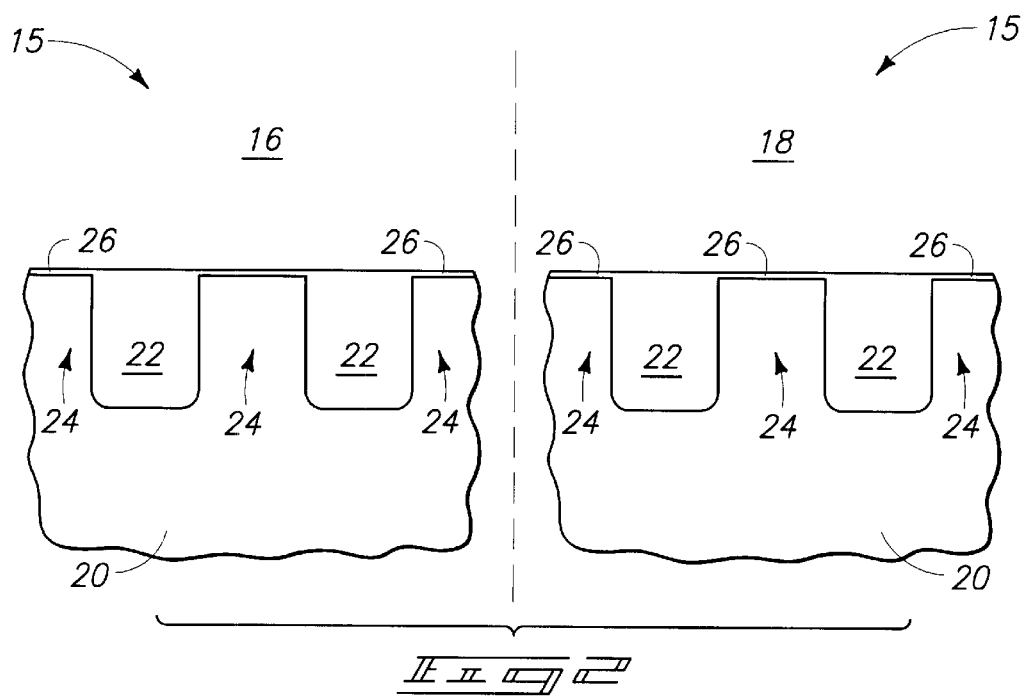
FIG. 2 is a diagrammatic sectional view of a wafer fragment at a processing in accordance with an aspect of the invention.

Methods of forming an array of FLASH field effect transistors and circuitry peripheral to such array are described in preferred embodiments below and, by way of example only, as shown in FIGS. 2–17. Referring initially to FIG. 2, a wafer fragment 15 is depicted as comprising an of exemplary array area 16 and a periphery area 18. Substrate 15 comprises a semiconductor substrate 20, preferably constituting bulk monocrystalline silicon. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document, the term "layer" includes both the singular and the plural unless otherwise indicated.

Bulk substrate 20 has been processed to form field isolation regions 22 and active area 24 therebetween. In the depicted embodiment, field isolation 22 is in the form of trench isolation, with but one example preferred material being silicon dioxide preferably deposited by high density plasma deposition. In the depicted preferred embodiment and as generally described above, such has been formed in part by using a pad oxide 26 which is shown remaining at least over active areas 24. An exemplary thickness for such pad oxide is from 80 Angstroms to 150 Angstroms over active areas 24.

Figure 3:
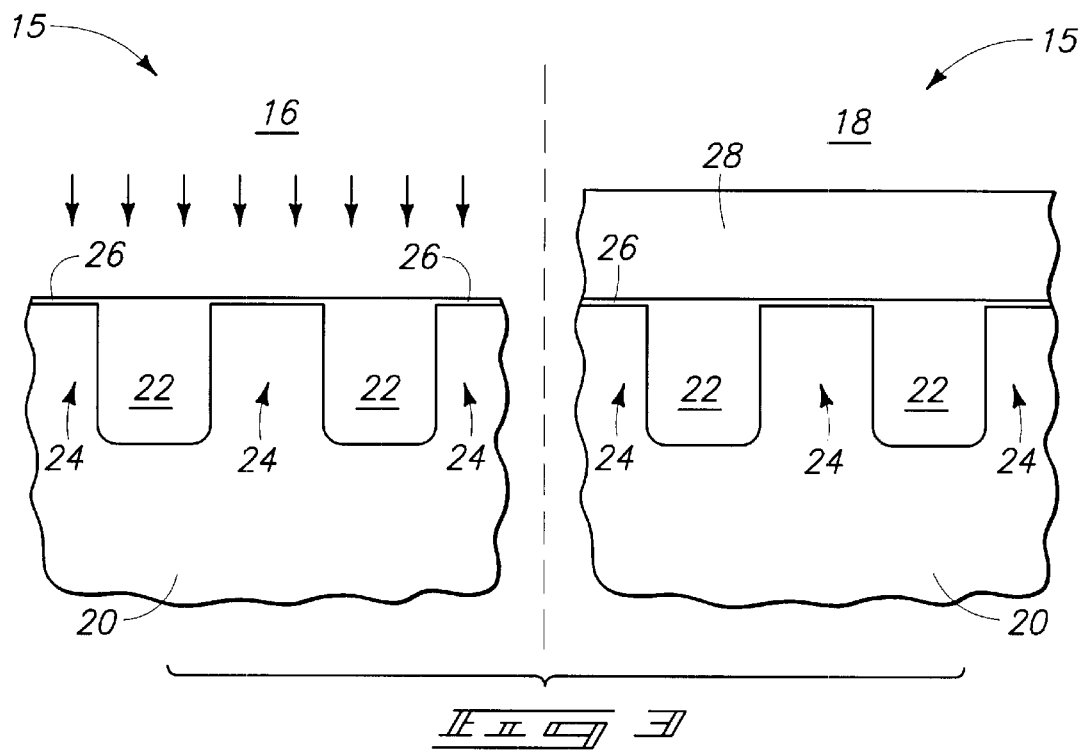
FIG. 3 is a view of the FIG. 2 wafer fragment at a processing step at subsequent to that shown by FIG. 2.

Referring to FIG. 3, a mask 28 is formed over periphery 18 with array 16 remaining exposed. An exemplary material for mask 28 is photoresist. At least one conductivity modifying implant is conducted into the semiconductive material of the substrate within array 16 (i.e., as indicated by the depicted vertical arrows, by way of example only) through pad oxide within array 16. Mask 28 largely shields substrate material 20 therebeneath from such implant. Example preferred implants include one or both of a $V_t$ implant and a channel enhancement implant.

Figure 4:
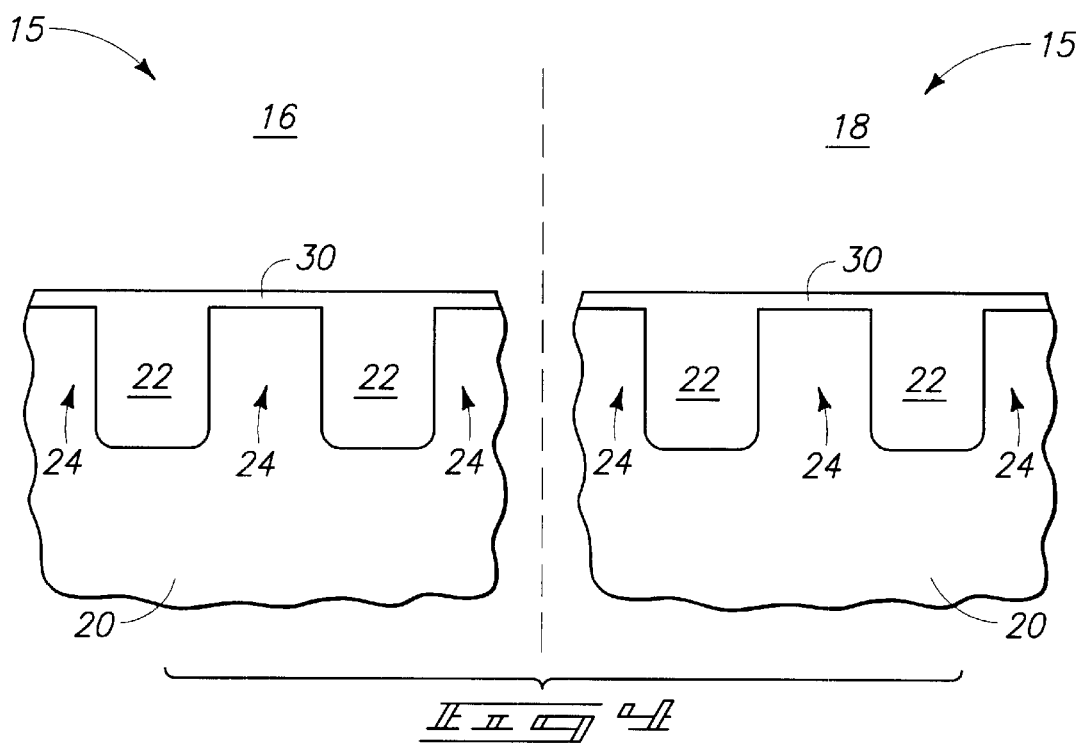
FIG. 4 is a view of the FIG. 3 wafer fragment at a processing step subsequent to that shown by FIG. 3.

Referring to FIG. 4, mask 28 has been removed and a sacrificial oxide 30 is globally formed over substrate 15 and, accordingly, over array area 16 and periphery area 18. A preferred method of such is by thermal oxidation and the growing of layer 30 through and proximate any pad oxide, for example using an atmospheric furnace oxidation at 800°

C. utilizing a hydrogen and oxygen containing chemistry. A preferred thickness for sacrificial oxide 30 (including any pad oxide) over the active area is from about 120 Angstroms to about 200 Angstroms.

Referring to FIG. 5, the sacrificial oxide and any remaining pad oxide has been removed from the substrate. Preferably, such removing is by etching using any suitable wet or dry chemistry, such as a wet buffered oxide etch. Polishing could of course also and/or alternately be used.

Referring to FIG. 6, a gate dielectric 32, typically silicon dioxide, has been formed. Typically, such oxide formation is conducted by thermal growth. An exemplary preferred thickness for layer 32 is from 90 Angstroms to 120 Angstroms.

Figure 7:
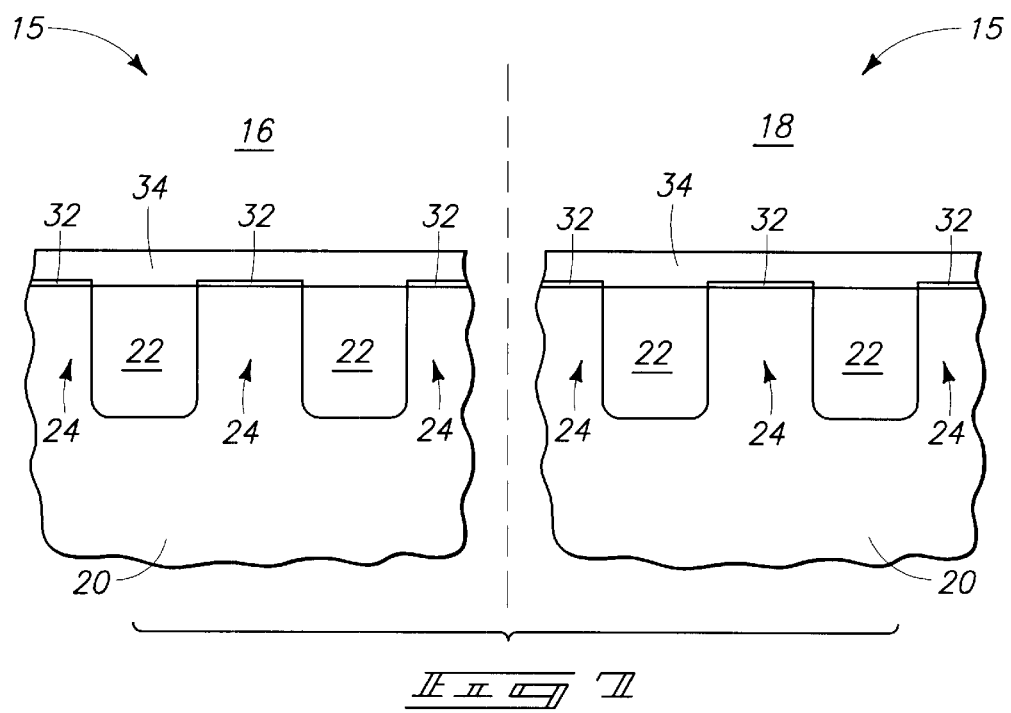
FIG. 7 is a view of the FIG. 6 wafer fragment at a processing step subsequent to that shown by FIG. 6.

Referring to FIG. 7, a suitable floating gate material (i.e., conductively doped semiconductive material) is formed at least within array 16 over gate oxide 32 and, as well, over periphery 18 as shown. An example material is polysilicon.

The above provides but one exemplary process and depiction of a method of forming floating gate material within an array over active area. Any other method for doing so is contemplated, whether existing or yet-to-be developed. Further by way of example only and in no way by way of limitation nor necessarily of preference, any of the processing described in our co-pending, co-filed applications could also be utilized where appropriate. Said co-pending, co-filed applications are U.S. patent application Ser. No. 10/179,868, entitled "Methods Of Forming An Array Of FLASH Field Effect Transistors And Circuitry Peripheral To Such Array", naming Mark A. Helm and Roger W Lindsay as inventors under attorney docket number MI22-1998; and U.S. patent application Ser. No. 10/179,893, entitled "Methods Of Forming An Array Of FLASH Field Effect Transistors And Circuitry Peripheral To Such Array", naming Roger A. Lindsay and Mark A. Helm as inventors under both of which are fully incorporated herein by reference.

Figure 8:
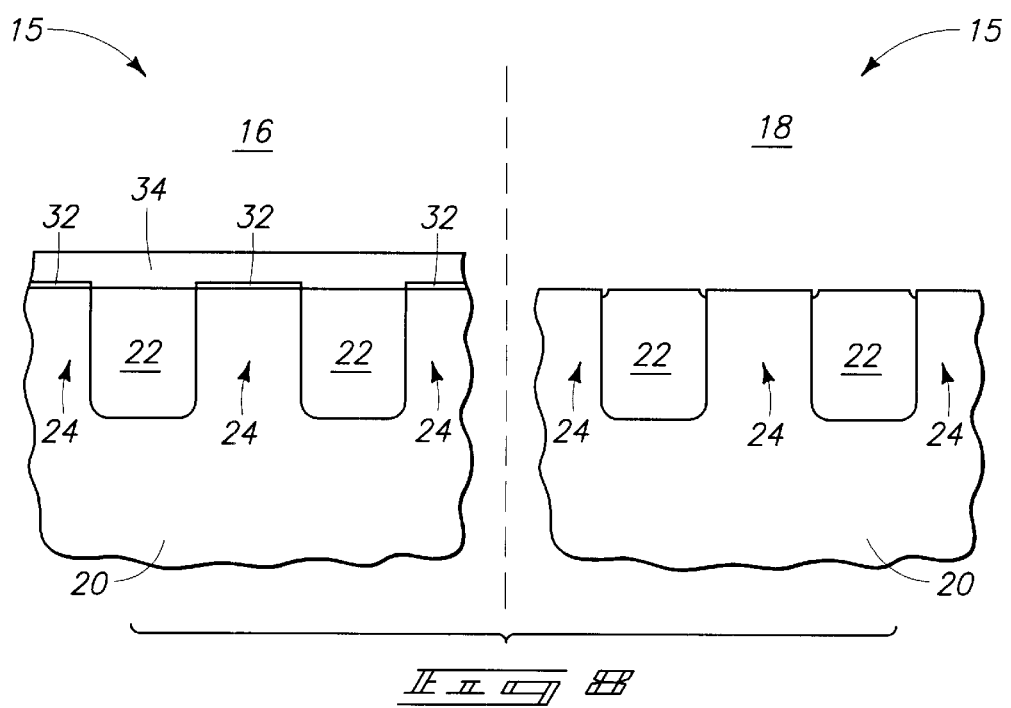
FIG. 8 is a view of the FIG. 7 wafer fragment at a processing step subsequent to that shown by FIG. 7.

Referring to FIG. 8, floating gate conductively doped semiconductive material 34 would typically then be patterned (by way of example only, using photoresist masking and etch) in at least one direction/dimension within array 16, and be removed from periphery 18. Oxide 32 within periphery 18 may or may not be fully or partially removed here. If fully removed, active area/isolation oxide interface etching may occur of the isolation oxide, as shown.

Figure 9:
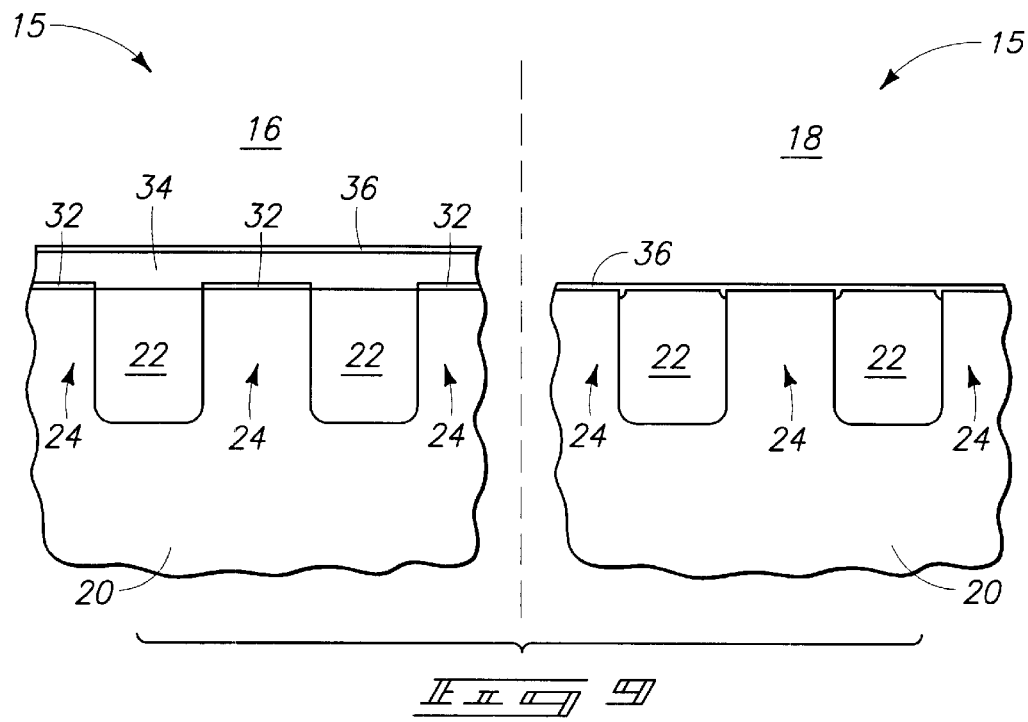
FIG. 9 is a view of the FIG. 8 wafer fragment at a processing step subsequent to that shown by FIG. 8.

Referring to FIG. 9, a control gate dielectric 36 would be formed over floating gate conductively doped semiconductive material 34 within array 16, and typically accordingly also within periphery 18. An exemplary preferred material 36 is a composite of silicon dioxide-silicon nitride-silicon dioxide layers. Exemplary thicknesses, bottom-to-top, are 40 Angstroms, 100 Angstroms and 30 Angstroms, respectively. Accordingly, in one preferred embodiment, material 36 comprises at least an oxide layer/portion over floating gate material 34 within array 16.

Figure 10:
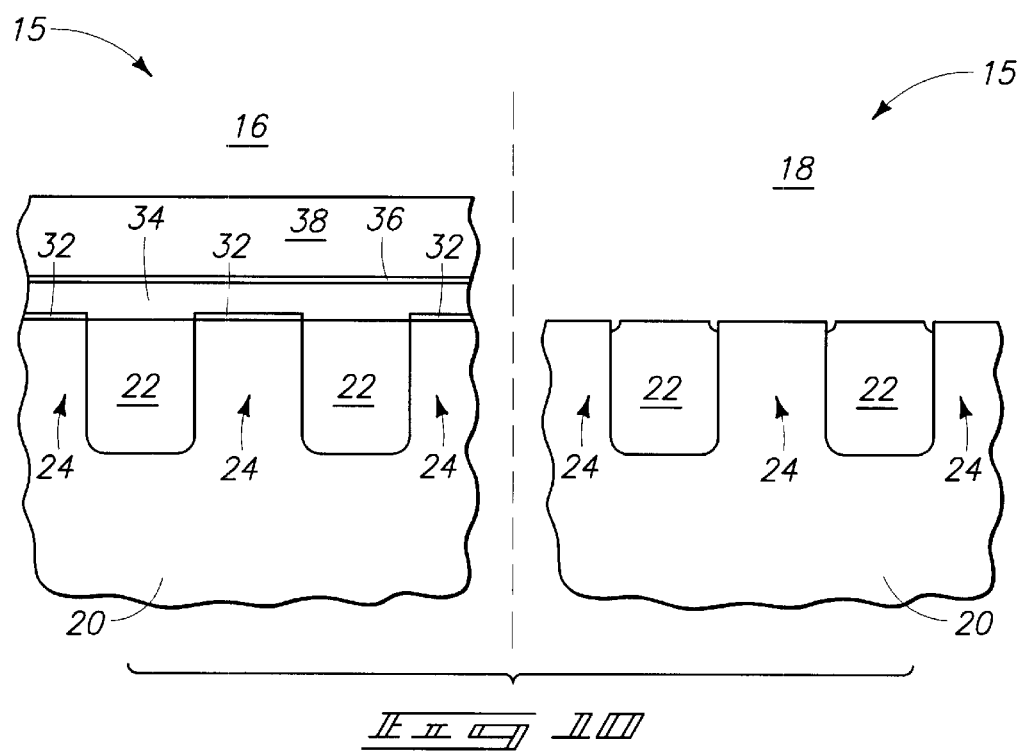
FIG. 10 is a view of the FIG. 9 wafer fragment at a processing step subsequent to that shown by FIG. 9.

Referring to FIG. 10, a mask 38 is formed over gate dielectric 36 within array 16, and gate dielectric 36 within periphery 18 is etched away. Such could be conducted using one or a combination of various existing or yet-to-be developed wet or dry etch chemistries. By way of example only, mask 38 can comprise photoresist. Any remaining oxide 32 would desirably etched away with etching of material 36.

Figure 11:
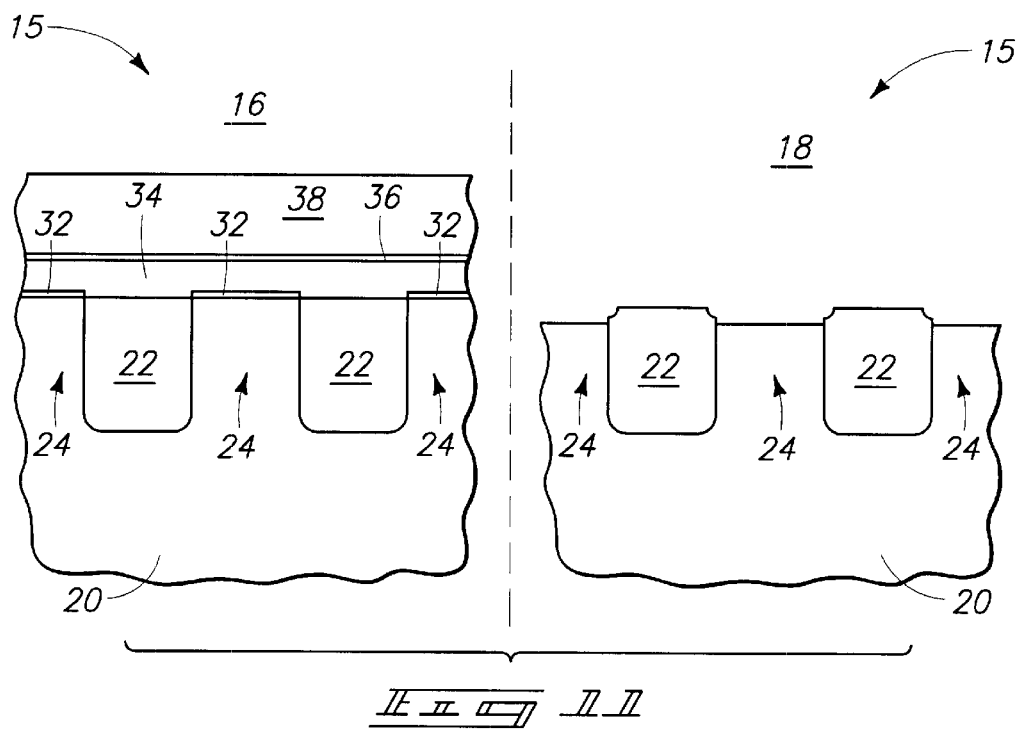
FIG. 11 is a view of the FIG. 10 wafer fragment at a processing step subsequent to that shown by FIG. 10.

Referring to FIG. 11 and using mask 38, periphery active area semiconductive material 20 is etched substantially selectively relative to periphery field isolation 22. In the context of this document, "substantially selectively" refers to an etch rate of one material relative to another of at least 1.5:1. In one considered aspect of the invention, such provides but one example of etching periphery active area semiconductive material of a substrate substantially selectively relative to periphery field isolation while not etching array active area semiconductive material.

Preferably, the FIG. 11 depicted periphery active area etching etches no more than 500 Angstroms of thickness of the periphery active area semiconductive material, and more preferably no more than 400 Angstroms of such thickness. A preferred range of such substrate active area etching is from 100 Angstroms to 400 Angstroms of thickness of the periphery active area semiconductive material.

Figure 12:
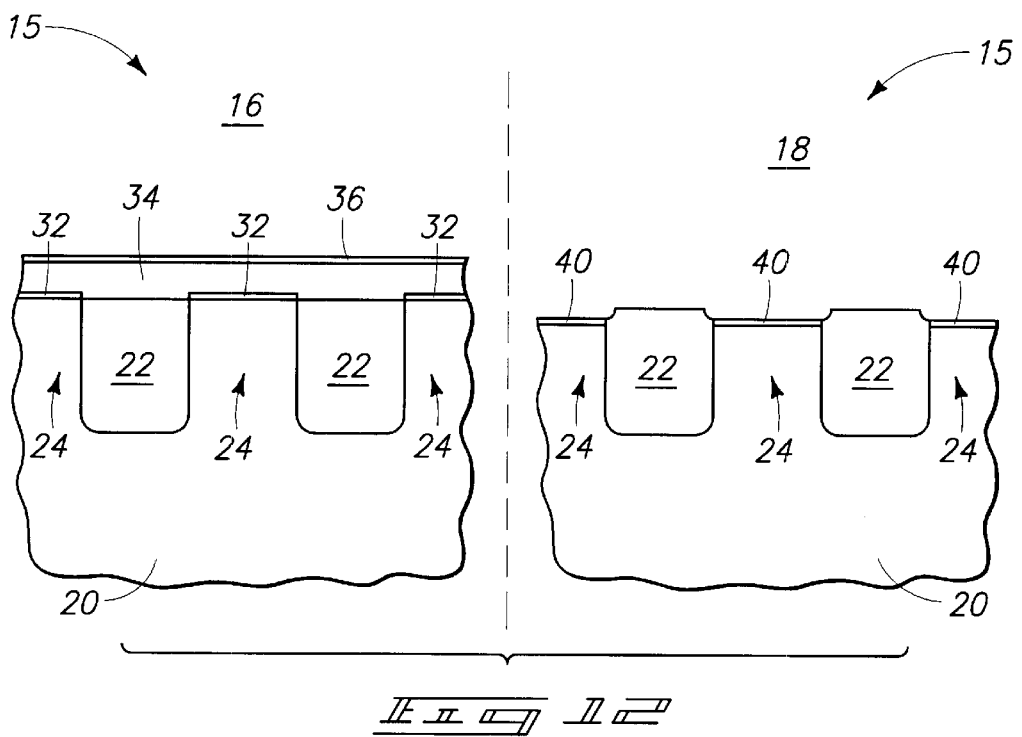
FIG. 12 is a view of the FIG. 11 wafer fragment at a processing step subsequent to that shown by FIG. 11.

Referring to FIG. 12, masking 38 has been removed and a sacrificial oxide 40 subsequently formed over the periphery active area. Such is preferably conducted to prepare the outer portion and surface of such active area for gate dielectric formation. An exemplary thickness for sacrificial oxide 40 is from 50 Angstroms to 100 Angstroms.

Figure 13:
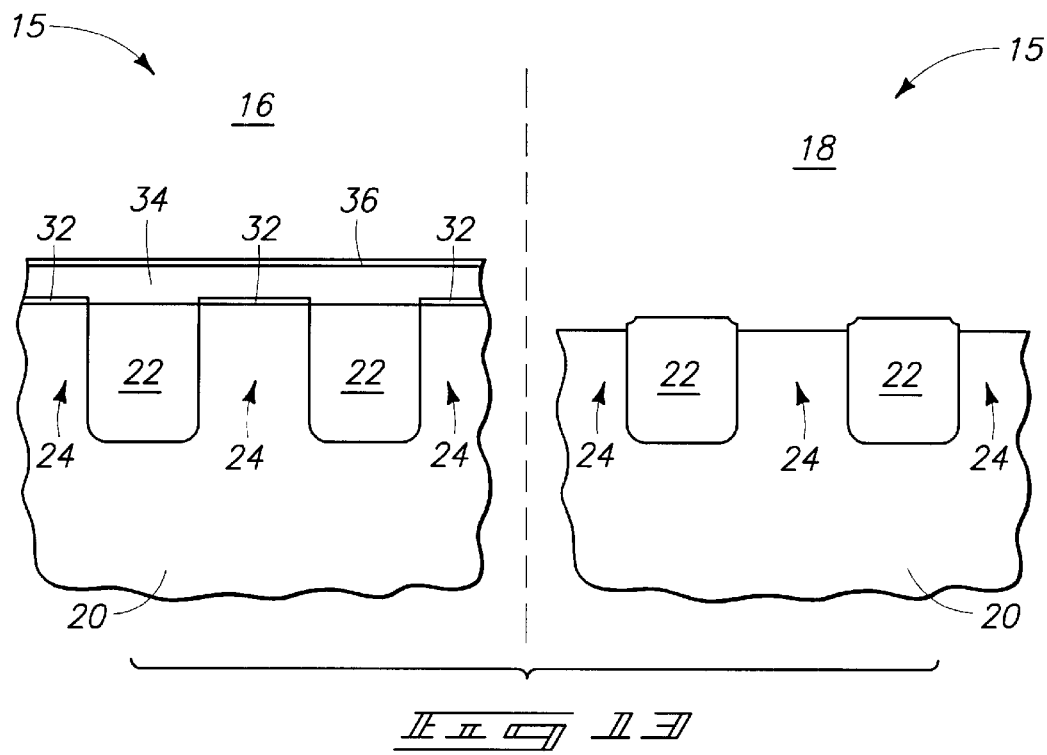
FIG. 13 is a view of the FIG. 12 wafer fragment at a processing step subsequent to that shown by FIG. 12.

Referring to FIG. 13, sacrificial oxide 40 and an outer portion of field isolation oxide 22 in periphery 18 have been removed in an etching common to both, and effective to expose periphery active area semiconductive material. Any suitable wet or dry oxide etching can be utilized, for example a wet buffered oxide etching.

Figure 1:
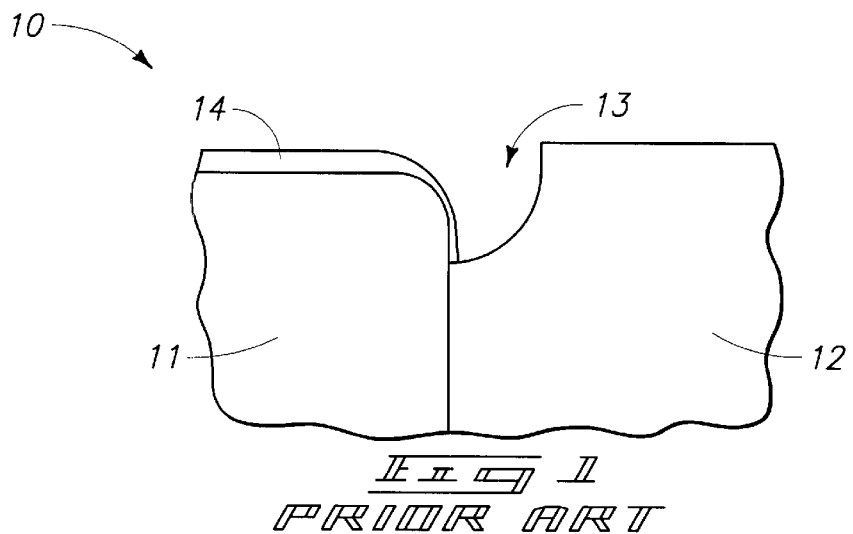
FIG. 1 is a diagrammatic sectional view of a prior art wafer fragment.
Figure 14:
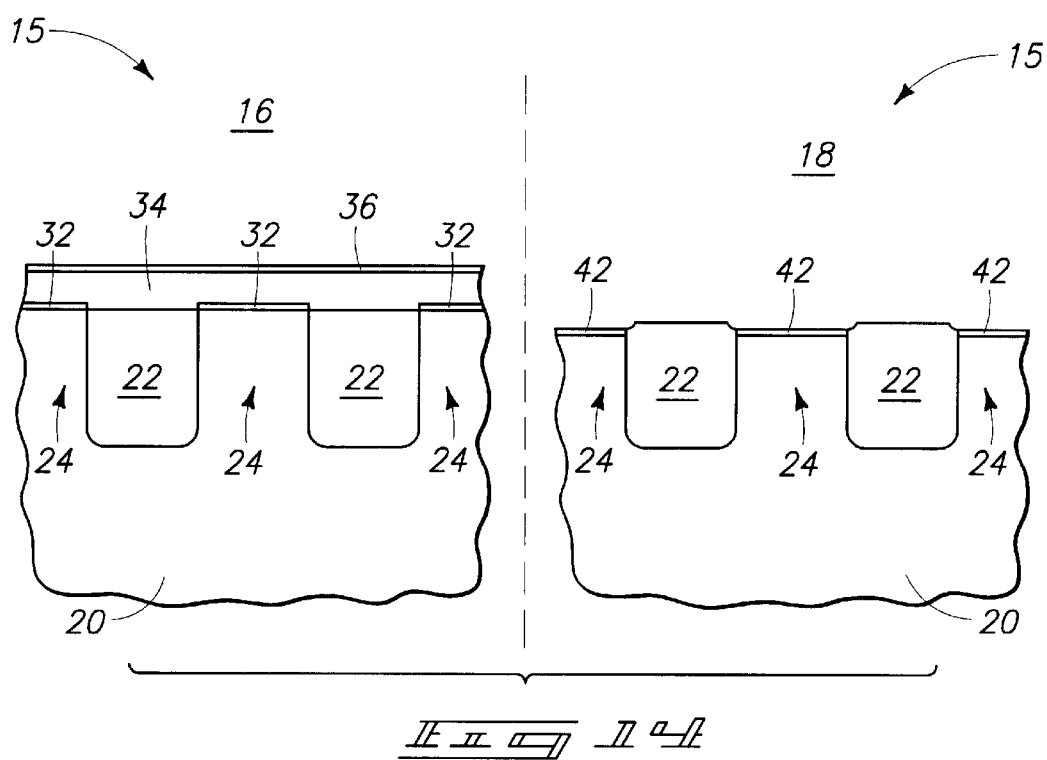
FIG. 14 is a view of the FIG. 13 wafer fragment at a processing step subsequent to that shown by FIG. 13.
Figure 15:
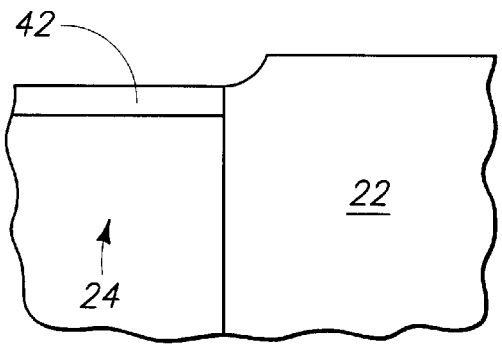
FIG. 15 is an enlarged diagrammatic sectional view of a portion of a wafer fragment processed in accordance with an aspect of the invention.

Referring to FIG. 14, a periphery gate dielectric layer 42 (i.e., silicon dioxide) is formed on monocrystalline silicon 20 of active area 24 within periphery 18. As referred to above, such formation is preferably thermal and optimized for periphery circuit transistors. An exemplary preferred thickness for gate dielectric 42 is from 120 Angstroms to 180 Angstroms. By way of example only, FIG. 15 depicts a preferred intended effect of reduced or eliminated gate oxide thinning in comparison to that shown by FIG. 1 at least occurring due to the exemplary FIG. 11 processing. FIGS. 1 and 15 depict enlarged sectional views taken at ninety degrees to those diagrammatically shown in FIGS. 2–14.

Figure 16:
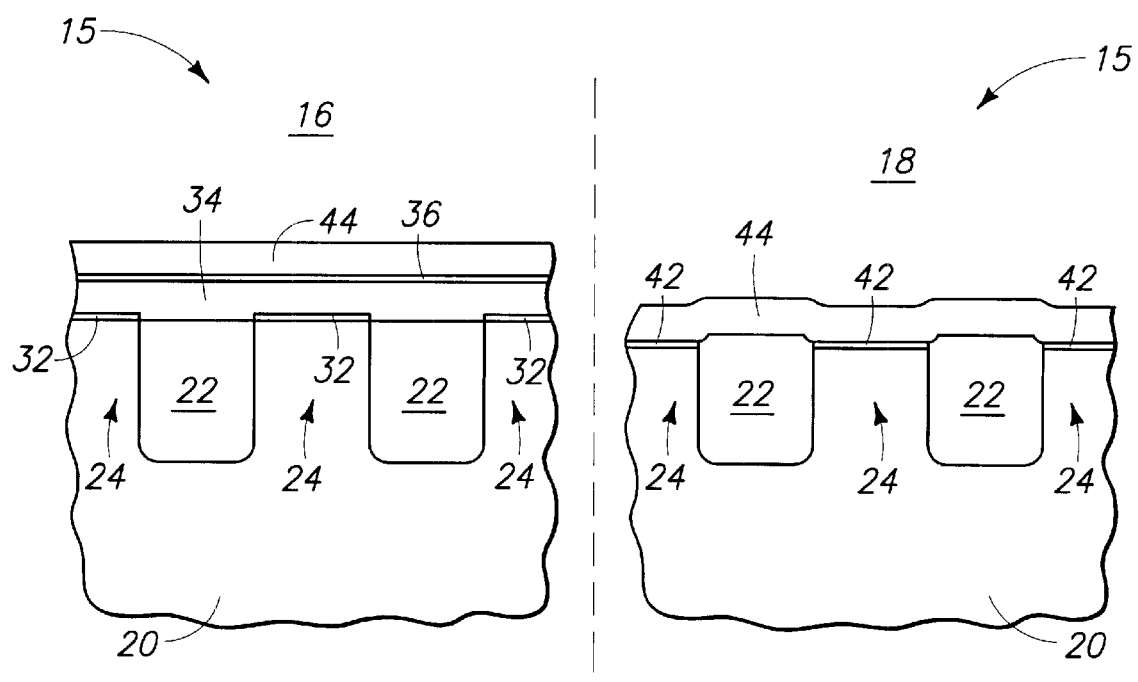
FIG. 16 is a view of the FIG. 14 wafer fragment at a processing step subsequent to that shown by FIG. 14.

Referring to FIG. 16, gate material 44 (i.e., polysilicon) is formed over array 16 and periphery 18.

Figure 17:
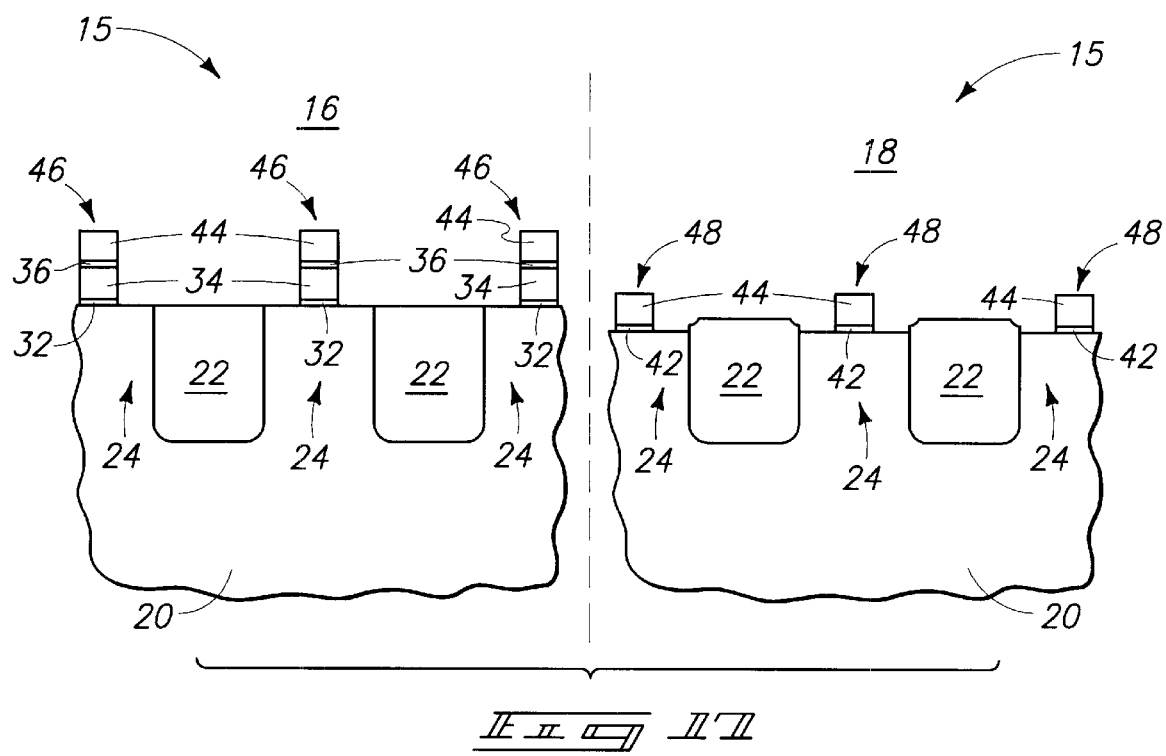
FIG. 17 is a view of the FIG. 16 wafer fragment at a processing step subsequent to that shown by FIG. 16.

Referring to FIG. 17, the depicted FIG. 16 materials have been patterned into at least some FLASH control transistor gate lines 46 within array 16, and into at least some non-FLASH transistor gate lines 48 within periphery 18. Source/drains would also be formed.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming an array of FLASH field effect transistors within array area and circuit peripheral to the array within a periphery area comprising:

etching periphery active area semiconductive material of a substrate substantially selectively relative to periphery field isolation while not etching array active area semiconductive material; and after the periphery active area etching, forming at least some FLASH transistor control gate material within the array area and at least some non-FLASH transistor gate material within the periphery area.

2. The method of claim 1 comprising forming floating gate material at least within the array prior area to the etching.

3. The method of claim 1 comprising forming floating gate material at least within the array area prior to the etching, and masking the floating gate material within the array area during the etching.

4. The method of claim 1 wherein the periphery active area etching etches no more than 500 Angstroms of thickness of the periphery active area semiconductive material.

5. The method of claim 1 wherein the periphery active area etching etches no more than 400 Angstroms of thickness of the periphery active area semiconductive material.

6. The method of claim 1 wherein the periphery active area etching etches from 100 Angstroms to 400 Angstroms of thickness of the periphery active area semiconductive material.

7. The method of claim 1 comprising masking the array area with a masking layer on the substrate during the periphery active area etching.

8. The method of claim 1 wherein the semiconductive material comprises bulk monocrystalline silicon.

9. The method of claim 1 wherein the periphery field isolation comprises silicon dioxide.

10. The method of claim 1 comprising after the periphery active area etching and before the forming both thermally growing a sacrificial oxide over the substrate and removing the sacrificial oxide.

11. The method of claim 1 comprising forming the non-FLASH transistor gates within the periphery area to have greater thickness gate dielectric than that of the FLASH transistor gates within the array area.

12. The method of claim 1 comprising forming the non-FLASH transistor gates within the periphery area to have greater thickness gate dielectric than that of the FLASH transistor gates within the array area and forming the gate dielectric of the array area FLASH transistors prior to forming the gate dielectric of the periphery area non-FLASH transistors.

13. A method of forming an array of FLASH field effect transistors and circuitry peripheral to the array comprising:
   forming active area semiconductive material and field isolation relative to an array area and a periphery area of a semiconductor substrate;
   masking array active area semiconductive material while etching periphery active area semiconductive material substantially selectively relative to the periphery field isolation;
   after the etching, removing the masking; and
   after removing the masking, forming at least some FLASH transistor control gate material within the array area and at least some non-FLASH transistor gate material within the periphery area.

14. The method of claim 13 comprising forming floating gate material at least within the array area prior to the etching, said masking also masking the floating gate material.

15. The method of claim 13 wherein the masking comprises photoresist.

16. The method of claim 13 wherein the periphery active area etching etches no more than 500 Angstroms of thickness of the periphery active area semiconductive material.

17. The method of claim 13 wherein the periphery active area etching etches no more than 400 Angstroms of thickness of the periphery active area semiconductive material.

18. The method of claim 13 wherein the periphery active area etching etches from 100 Angstroms to 400 Angstroms of thickness of the periphery active area semiconductive material.

19. The method of claim 13 wherein the semiconductive material comprises bulk monocrystalline silicon.

20. The method of claim 13 wherein the periphery field isolation comprises silicon dioxide.

21. The method of claim 13 comprising after the periphery active area etching, after the removing and before the forming of some FLASH transistor and non-FLASH transistor gate material, both thermally growing a sacrificial oxide over the substrate and removing the sacrificial oxide.

22. The method of claim 13 comprising forming the non-FLASH transistor gates within the periphery area to have greater thickness gate dielectric than that of the FLASH transistor gates within the array area.

23. The method of claim 13 comprising forming the non-FLASH transistor gates within the periphery area to have greater thickness gate dielectric than that of the FLASH transistor gates within the array area, and forming the gate dielectric of the array area FLASH transistors prior to forming the gate dielectric of the periphery area non-FLASH transistors.

24. A method of forming an array of FLASH field effect transistors and circuitry peripheral to the array, comprising:
   forming active area semiconductive material and field isolation relative to an array area and a periphery area of a semiconductor substrate;
   forming floating gate material within the array area over active area;
   forming a gate dielectric over the floating gate material within the array area and over the periphery area;
   masking the array gate dielectric while etching the gate dielectric in the periphery area;
   after the periphery area gate dielectric etching and using the array masking, etching periphery active area semiconductive material substantially selectively relative to the periphery field isolation;.
   after the periphery active area semiconductive material etching, removing the masking; and
   after removing the masking, forming at least some FLASH transistor control gate material within the array area and at least some non-FLASH transistor gate material within the periphery area.

25. The method of claim 24 comprising after the periphery active area etching, after the removing and before the forming of some FLASH transistor and non-FLASH transistor gate material, both thermally growing a sacrificial oxide over the substrate and removing the sacrificial oxide.

26. The method of claim 24 wherein the gate dielectric comprises silicon dioxide.

27. The method of claim 24 wherein the floating gate material comprises conductively doped polysilicon.

28. The method of claim 24 wherein the masking comprises photoresist.

29. The method of claim 24 wherein the periphery active area etching etches no more than 500 Angstroms of thickness of the periphery active area semiconductive material.

30. The method of claim 24 wherein the periphery active area etching etches no more than 400 Angstroms of thickness of the periphery active area semiconductive material.

31. The method of claim 24 wherein the periphery active area etching etches from 100 Angstroms to 400 Angstroms of thickness of the periphery active area semiconductive material.

32. The method of claim 24 wherein the semiconductive material comprises bulk monocrystalline silicon.

33. The method of claim 24 wherein the periphery field isolation comprises silicon dioxide.

34. The method of claim 24 comprising forming the non-FLASH transistor gates within the periphery area to have greater thickness gate dielectric than that of the FLASH transistor gates within the array area.

35. The method of claim 24 comprising forming the non-FLASH transistor gates within the periphery area to have greater thickness gate dielectric than that of the FLASH transistor gates within the array area, and forming the gate dielectric of the array area FLASH transistors prior to forming the gate dielectric of the periphery area non-FLASH transistors.

36. A method of forming an array of FLASH field effect transistors and circuitry peripheral to the array, comprising:

forming active area semiconductive material and field isolation oxide relative to an array area and a periphery area of a semiconductor substrate;

forming floating gate material within the array area over active area;

forming a gate dielectric over the floating gate material within the array area and over the periphery area;

masking the array area gate dielectric while etching the gate dielectric in the periphery area;

after the periphery area gate dielectric etching and using the array area masking, etching periphery area active area semiconductive material substantially selectively relative to the periphery field isolation oxide;

after the periphery active area semiconductive material etching, removing the masking;

after removing the masking, forming a sacrificial oxide over periphery active area;

removing the sacrificial oxide and an outer portion of the field isolation oxide in the periphery area in a common etching and effective to expose periphery active area semiconductive material;

after the common etching, forming a gate dielectric layer over periphery active area semiconductive material; and after forming the periphery area gate dielectric layer, forming at least some FLASH transistor control gate material within the array area and at least some non-FLASH transistor gate material within the periphery area.

37. The method of claim 36 wherein the floating gate material comprises conductively doped polysilicon.

38. The method of claim 36 wherein the masking comprises photoresist.

39. The method of claim 36 wherein the periphery active area etching etches no more than 500 Angstroms of thickness of the periphery active area semiconductive material.

40. The method of claim 36 wherein the periphery active area etching etches no more than 400 Angstroms of thickness of the periphery active area semiconductive material.

41. The method of claim 36 wherein the periphery active area etching etches from 100 Angstroms to 400 Angstroms of thickness of the periphery active area semiconductive material.

42. The method of claim 36 wherein the semiconductive material comprises bulk monocrystalline silicon.

43. The method of claim 36 wherein the periphery field isolation comprises silicon dioxide.

44. The method of claim 36 comprising forming the non-FLASH transistor gates within the periphery area to have greater thickness gate dielectric than that of the FLASH transistor gates within the array area.

45. The method of claim 36 comprising forming the non-FLASH transistor gates within the periphery area to have greater thickness gate dielectric than that of the FLASH transistor gates within the array area, and forming the gate dielectric of the array area FLASH transistors prior to forming the gate dielectric of the periphery area non-FLASH transistors.

* * * * *

UNITED STATES PATENT AND TRADEMARK OFFICE
CERTIFICATE OF CORRECTION

PATENT NO. : 6,579,763 B1
DATED : June 17, 2003
INVENTOR(S) : Roger W. Lindsay

It is certified that error appears in the above-identified patent and that said Letters Patent is hereby corrected as shown below:

Column 1,
Line 18, replace "location, are referred to as random-access memories (RAM)." with
-- location, are referred to as random-access memories (RAMs). --

Column 3,
Line 48, replace "processing step at subsequent to that shown by FIG. 2." with
-- processing step subsequent to that shown by FIG. 2. --

Column 4,
Line 24, replace "FIG. 2, a wafer fragment 15 is depicted as comprising an of" with
-- FIG. 2, a wafer fragment 15 is depicted as comprising an --

Column 5,
Line 34, replace "Circuitry Peripheral To Such Array", naming Roger A." with
-- Circuitry Peripheral To Such Array", naming Roger W --
Line 62, replace "would desirably etched away with etching of material 36." with
-- would desirably be etched away with etching of material 36. --

Column 6,
Line 55, replace "transistors within array area and circuit peripheral to the" with
-- transistors within an array area and circuitry peripheral to the --
Line 66, replace "gate material at least within the array prior area to the" with -- gate material at least within the array area prior to the --

Column 8,
Line 28, replace "masking the array gate dielectric while etching the gate" with
-- masking the array area gate dielectric while etching the gate --
Line 31, replace "the array masking, etching periphery active area" with -- the array area masking, etching periphery active area --
Line 33, replace "the periphery field isolation;." with -- the periphery area field isolation; --

UNITED STATES PATENT AND TRADEMARK OFFICE
CERTIFICATE OF CORRECTION

PATENT NO. : 6,579,763 B1
DATED : June 17, 2003
INVENTOR(S) : Roger W. Lindsay

It is certified that error appears in the above-identified patent and that said Letters Patent is hereby corrected as shown below:

Column 9,
Line 22, replace "the array area masking, etching periphery area active" with -- the array area masking, etching periphery active --

Signed and Sealed this

Twenty-eighth Day of October, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,579,763 B1
DATED : June 17, 2003
INVENTOR(S) : Roger W. Lindsay

It is certified that error appears in the above-identified patent and that said Letters Patent is hereby corrected as shown below:

<u>Column 6,</u>
Line 5, after "material." insert sentence -- In the depicted and preferred embodiment, such occurs by a masking of the array during such etching. --

Signed and Sealed this

Ninth Day of March, 2004

JON W. DUDAS
*Acting Director of the United States Patent and Trademark Office*